June 13, 1961 P. N. WOLFE ET AL 2,988,646

SOLID STATE IMAGE-PRODUCING SCREENS

Filed March 25, 1958 2 Sheets-Sheet 1

WITNESSES:

Bernard R. Giegue

Wm. B. Sellers

INVENTORS
Peter N. Wolfe and
Edgar A. Sack, Jr.
BY
Charles V. Rang
ATTORNEY

United States Patent Office 2,988,646
Patented June 13, 1961

2,988,646
SOLID STATE IMAGE-PRODUCING SCREENS

Peter N. Wolfe and Edgar A. Sack, Jr., Penn Hills, Pa., assignors to Westinghouse Electric Corporation, East Pittsburgh, Pa., a corporation of Pennsylvania Filed Mar. 25, 1958, Ser. No. 723,679
11 Claims. (Cl. 250—213)

This invention relates generally to solid state image-producing screens and more particularly to solid state image-producing screens that function in response to signals delivered optically, electrically, or both.

Screens of a solid state image-producing type that function as light amplifiers and which utilize photoconductive materials in combination with electroluminescent materials have appeared in the prior art. Such devices respond to light signals but the light amplifier gain is low. Further, design considerations limit the frequency of the potential that may be applied to the electroluminescent material of such light amplifiers, and therefore the output brightness is limited.

The object of this invention is to provide for utilizing in an image-producing screen an electroluminescent material as an output transducer, a nonlinear dielectric material for maintaining a light power potential across the electroluminescent material in accordance with the charge that the nonlinear dielectric material carries and a photoconductive material as an input transducer for controlling the charge on the nonlinear dielectric material in accordance with a received light signal, an electrical signal or both.

It is also an object of the invention to provide a solid state image-producing screen which responds to the intensity of an optical input signal to produce an output image of corresponding intensity.

A further object of the invention is to provide a solid state image-producing screen which enables the commutation of an electrical input signal on the screen by a light beam.

A still further object of the invention is to provide an image-producing screen which will respond to a momentary input signal to establish an output image which is held.

Other objects of the invention will, in part, be obvious and will in part, appear hereinafter.

The invention accordingly comprises the features of construction, the combination of elements, and arrangement of parts, which will be exemplified in the construction hereinafter set forth and the scope of the application of which will be indicated in the claims.

For a fuller understanding of the nature and objects of the invention, reference should be had to the following detailed description taken in connection with the accompanying drawing, in which.

Figure 1:
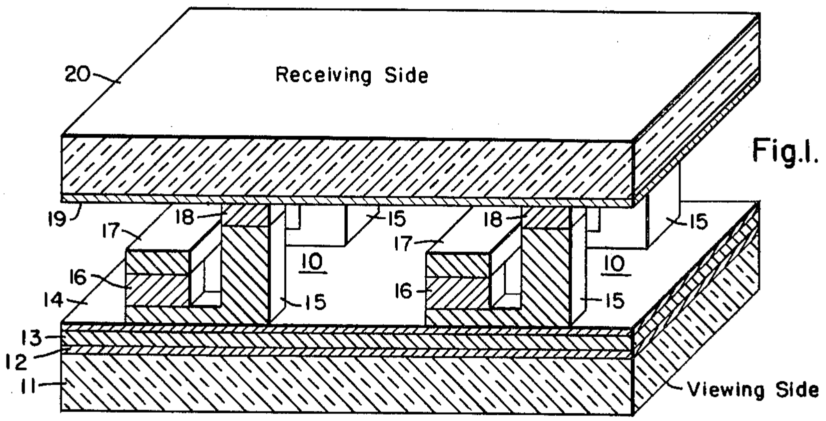
FIGURE 1 is a perspective view of a solid state image-producing screen with portions broken away to show details of the construction of a plurality of the elements and how they are disposed in the screen.

Referring now to the drawing and FIG. 1 in particular, the embodiment of the solid state image-producing screen illustrated comprises a plurality of elements shown generally at 10 which are disposed to be responsive to an input signal and cooperative with other members of the screen to deliver an output or establish an image. In this drawing only two elements are shown. However, any number may be assembled in cooperative relationship depending upon the size of the image-producing screen that is required.

The screen structure will be described starting from the viewing or output side. As shown, a glass plate 11 which is transparent, has applied thereto a transparent electrode 12. Tin oxide has been found to be quite satisfactory for use as the electrode 12.

Next to the electrode 12 is a layer of electroluminescent material 13. The layer of electroluminescent material will be coextensive with the screen. Since electroluminescent materials or phosphors are well-known in the art, they need not be described in detail.

In order to prevent the light from the electroluminescent material from affecting other elements of the image-producing screen which will be described hereinafter, a layer of opaque, electrically conducting material, such as graphite 14 is applied to the layer of electroluminescent material 13. Since graphite is conductive, it provides good electrical connections between the electroluminescent material 13 and the electrodes 15 which are utilized in impressing a light power potential across the electroluminescent layer.

The electrodes 15 may be made of copper, aluminum or any other suitable conductive material. In this particular embodiment of the invention the electrodes 15 are L-shaped and are so disposed that they make electrical contact with the layer of graphite 14. It is pointed out that while in this particular embodiment, electrodes 15 are made of a particular shape, this is not a limiting feature as other shapes may be utilized. The L-shaped electrodes are adopted since they may be made readily by machine operations, in building this type of image-producing screen.

Small members or squares of ferroelectric or nonlinear dielectric material 16 are applied to the electrodes 15 and in electrical contact therewith. The squares 16 of ferroelectric material applied to the electrodes 15 are connected to one another by means of buses 17. The buses 17 are utilized for delivering an alternating current potential to the ferroelectric material in the operation of the screen.

Members of photoconductive material 18 are also applied to the electrodes 15. As shown the members of photoconductive material 18 and the ferroelectric material 16 are disposed in spaced relationship. A number of different types of photoconductive material such as cadmium sulphide, cadmium selenide and zinc sulphide may be utilized.

A transparent electrode 19 such as tin oxide is applied to a transparent glass plate 20 and the two are mounted on and in electrical contact with the members 18 of photoconductive material. The glass plate 20 carrying the transparent electrode 19 constitutes the receiving side of the image producing screen.

As described each element 10 comprises photoconductive material 18, electroluminescent material 13 and nonlinear dielectric material 16 and associated electrodes for delivering potentials and signals.

When a signal is delivered to one of the elements 10 of the image producing screen, it will be localized even though the elements are connected to one another through the opaque layer of conductive graphite 14 and the layer 13 of electroluminescent material. In explaining the localizing of the signal, it is sometimes said that graphite and electroluminescent materials have a high impedance to the transverse flow of current. The explanation of this statement is, that the layers 14 of graphite and 13 of electroluminescent material are thin relative to the distance between the units 10 and consequently offer a low resistance to the flow of current from the electrode 15 to the electrode 12 but they offer high resistance, because of the distance, to the flow of electrical current from one electrode 15 to another electrode 15. Therefore, signals delivered to the different units 10 are localized.

In building the image producing screen, a number of elements 10 will be assembled in cooperative relationship. The number of elements will depend on the size of the screen and the resolution required. However, it is possible by utilizing a plurality of electrodes in combination with a single layer of the nonlinear dielectric material which has low transverse impedance to alternating current and a very high transverse impedance to direct current voltage as described hereinafter to build a single structure that will be large enough to serve as a viewing screen. Because of the high transverse impedance, the signals received will be localized.

Figure 2:
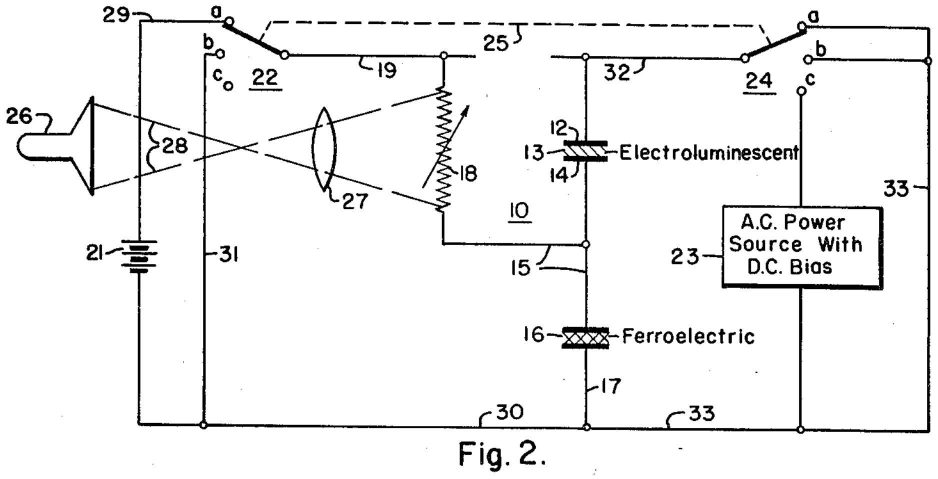
FIG. 2 is a diagram of a circuit system showing how a typical element of which the solid state image-producing screen is comprised is connected in an operative circuit system.

FIG. 2 shows how the elements of the solid state image producing screen are connected in circuit relationship. Methods for making the electrical connections between the members of the image producing screen and between these members and the conductors are well-known in the art and need not be described.

A battery or control power source shown generally at 21 is provided for supplying direct current or a control voltage for charging the nonlinear dielectric material of capacitor 16. A three-position switch 22 is provided for connecting the battery across the capacitor 16 as will be described hereinafter.

In the preceding paragraph when the term control power source is employed it is intended to include an alternating current power source which has a selected frequency and is synchronized with the other elements of the circuit. Further, the control power source may include an alternating current power source with a direct current bias adjusted to meet requirements. Since such power sources are known in the art they will not be described further.

A source of power shown generally at 23 is provided for supplying a light power potential or time varying light power potential to the electroluminescent material 13. The supply of time varying light power potential from the source 23 to the electroluminescent material is controlled by means of a three-position switch 24. The dotted line 25 extending between the switches 22 and 24 indicates that the switches are operated together. The other connections in the circuit system of FIG. 2 will appear as the description of the operation of the system proceeds.

The expression power source for supplying a time varying light power potential employed in the preceding paragraph is intended to include an alternating current power source having a direct current power source included as a bias. Since such combinations are well known they need not be described in detail.

It will be evident from the description given hereinafter that the image producing screen is so arranged that all the members of photoconductive material are disposed on one side of the opaque layer 14 which will be identified hereinafter as the input side while the electroluminescent material 13 is located on the opposite side which will be referred to in this specification as the output or viewing side. Therefore, in this embodiment of the invention, the input and output sides are optically isolated from one another to prevent the light from one side from interfering with the correct operation of the members on the other side. In the case where bistable operation is desired, it may also be necessary to incorporate shields to prevent light from one element reaching the photoconductors of adjacent elements.

As has been pointed out hereinbefore, the screen may be made to respond to an optical signal, an electrical signal, or both. The optical signal may be a source of invisible radiations, light or the reflected light from an object. Assuming now for purposes of explanation that the signal source 26 is a light source, for example a cathode ray tube 26 and that the light signal is delivered through a lens 27 which focuses the light beams, indicated by the dotted lines 28, into an image of the signal source, so that a selected part of that image is applied to the photoconductive material 18.

The switches 22 and 24 have been described as three-position switches. In the circuit diagram these positions are identified by the legends *a*, *b*, and *c*.

Photoconductive materials have the characteristic that when they are subjected to light the conductivity will change greatly. Different photoconductive materials will respond differently to radiations of different wave lengths. Therefore, some consideration will have to be given to the selection of right photoconductive material in the building of an image producing screen.

It will be assumed for purposes of explanation that the switches 22 and 24 stand in positions "*a*" which we will describe as the "sensitize" position and that the photoconductive material 18 is flooded with radiation of suitable wave length to change or lower its resistivity. When switch 22 stands in position "*a*," a circuit will extend from battery 21 through conductor 29, switch 22, electrode 19, photoconductive material 18, electrode 15, nonlinear dielectric material 16, bus 17 and conductor 30 back to the battery. The nonlinear material or capacitor 16 will be charged to the potential of the battery, since the photoconductive material is flooded with radiation and its resistance reduced to substantially zero.

When switch 24 stands in position "*a*," the power source 23 is not connected across the electroluminescent material 13. Further in view of the opaque layer 14 the electroluminescent material is not in any way affected by the radiation or other signal supplied to the photoconductive material 18.

The switches 22 and 24 are next moved to position "*b*" which may be described as the "expose" position. In this position, an image of similar or different wave lengths to the radiation wave length applied to the photoconductive material is now applied to the input side of the image producing screen for a predetermined period of time and then the application is terminated. When switch 22 stands in position "*b*" or the expose position, a circuit is established which extends from the switch 22 through electrode 19, photoconductive material 18, electrode 15, nonlinear dielectric material 16, bus 17, conductors 30 and 31, back to the switch 22. When this circuit is established, a part of the charge on the nonlinear dielectric material or ferroelectric material 16 is discharged, and the amount that remains will depend on the signals or radiation that the photoconductive material 18 has received. If the photoconductive material is receiving a substantial amount of radiation, its conductivity will be high and the nonlinear dielectric material 16 may be almost completely discharged. If the radiation being delivered to the photoconductive material 18 is low, or in other words, the input image is dark, the conductivity will be low and the charge on the nonlinear dielectric material 16 will remain substantially unchanged. The charge which remains on the nonlinear dielectric material is called the control charge which produces a control voltage.

The foregoing description is for one element of an image producing screen or for the application of a signal to a localized area of the screen, therefore, it will be readily appreciated that if there are a large number of elements or a number of signals delivered to localized areas of the image producing screen that the image on each element or localized area will vary with the light applied to the photoconductive material 18 connected in cooperative relationship with that element or area of the screen.

When switch 24 stands in position "*b*" a circuit will be established extending from the charged nonlinear dielectric material or ferroelectric material 16 through the electrode 15, the conductive opaque graphite layer 14, electroluminescent material 13, the transparent electrode 12, conductor 32, switch 24, conductor 33, bus 17 back to the charged nonlinear dielectric material 16. Therefore, the electroluminescent material is connected directly to the ferroelectric material 16 carrying a charge.

The switches 22 and 24 are next moved to position "*c*" which for purpose of explanation may be called the "read" position. In this position, the nonlinear dielectric material 16 is no longer connected across the battery 21.

When the switch 24 stands in position "*c*" the source 23 of alternating current is connected across the electroluminescent material 13 and the nonlinear dielectric material 16 connected in series circuit relationship. The circuit may be traced from the light power potential source 23 through switch 24 in position "*c*," conductor 32, electrode 12, electroluminescent material 13, the conductive opaque graphite layer 14, electrode 15, the nonlinear dielectric material 16, bus 17, conductor 33, back to the source 23.

The distribution of the voltage across the electroluminescent material 13 and the nonlinear dielectric material 16 will depend on the control charge remaining on the nonlinear dielectric material 16. If the voltage division results in a high voltage across the electroluminescent material 13 it will become bright. While if the nonlinear dielectric material 16 carries a high voltage and the division of voltage results in a low light power potential across the electroluminescent material, it will be dark. Therefore, the image on the output or viewing side of the screen will depend on the charge carried by the nonlinear dielectric material 16. Therefore, the light power frequency may be chosen for optimum brightness and not restricted to a low value by impedance match conditions in the circuit.

If the screen comprises a plurality of elements 10, they will function in the manner hereinbefore described. A common circuit system will be provided for all the elements. Each element will respond in accordance with the charging of its nonlinear dielectric material or capacitor 16, therefore, some of the elements 10 of the image-producing screen will be bright and some will be dark and an image will be established which corresponds to the image received.

The image-producing screen can be operated by a very weak light signal on the photoconductor 18 since between this input transducer 18 and the output transducer or electroluminescent material 13 there is a gain. The gain is introduced by the nonlinear dielectric material 16. This gain can be varied to meet the requirements of the image producing screen specification.

When two capacitors such as the electroluminescent material 13 and ferroelectric material 16 are employed in a circuit system such as FIG. 2, the image producing screen is not frequency sensitive.

If a negative output image is desired from the image producing screen as connected in FIG. 2, it can be obtained by first establishing the circuit for expose and flooding the photoconductive material 18 and then connecting the circuit for sensitize, which is the reverse of the functions "sensitize" and "expose" as described hereinbefore for the switches 22 and 24.

There are many applications in which a system such as disclosed in FIG. 2 may be utilized. Some of the applications are "still X-ray fluoroscopy," transient waveform observations, and the imaging of other "one-shot" phenomena.

Figure 3:
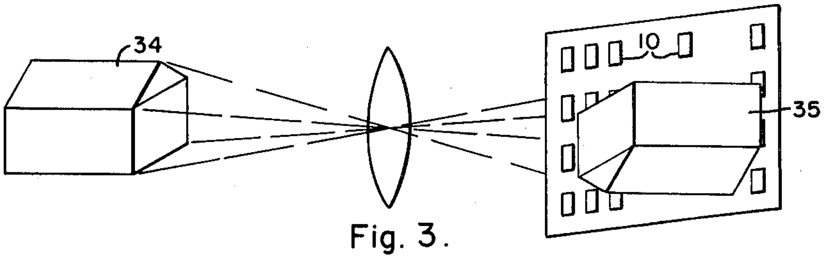
FIG. 3 is a diagrammatic view showing how an object delivers an optical signal which is transferred to the elements of the screen to establish an image of the object.

The diagram in FIG. 3 is submitted to show how reflected light from an object such as 34 may be transmitted to the image-producing screen comprising a plurality of elements 10 to establish an image 35 corresponding to the object. The image 35 established can be held for a time due to the storage of charges on the control capacitors 16 of the elements 10.

Figure 4:
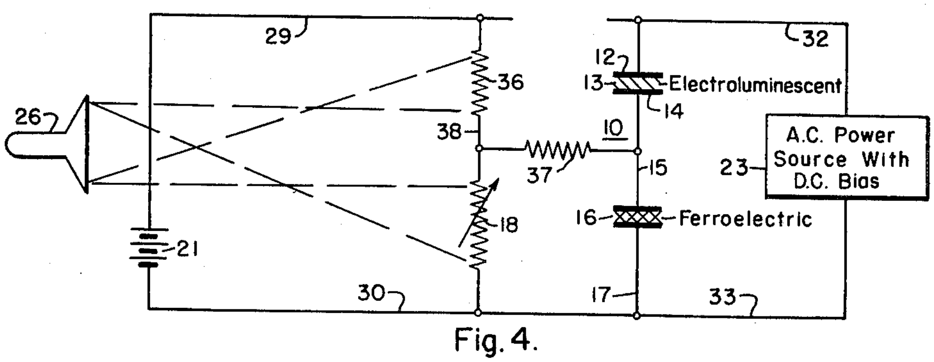
FIG. 4 is a diagram of a circuit system which is a modification of the circuit system of FIG. 2.

Referring now to FIG. 4, this circuit system contains many of the same members employed in the circuit system shown in FIG. 2 and they will be identified by the same numbers. Among the new members is a resistor 36 connected between the photoconductive material or cell 18 and the conductor 29. Another resistor 37 connects conductor 38, which is disposed between resistor 36 and photoconductive cell 18, to the conductor 15, extending between the electroluminescent cell 13 and the ferroelectric capacitor 16.

The resistor 36 and the photoconductive cell 18 may be described as a voltage divider which determines the control voltage from the battery 21 that will be applied across the nonlinear dielectric material or capacitor 16. The relative ohmic resistance of the resistor 36 and the photoconductive material 18 will depend on the conditions to be met.

The resistor 37 is an isolation unit for preventing the impedance of the photoconductive material from altering that of the ferroelectric capacitor 16. The ohmic value of the resistor 37 will depend on the design requirements of the particular circuit system.

There are two main circuits in the system. One for applying a control potential which may be traced from battery 21 through conductor 29, resistor 36, conductor 38, resistor 37, conductor 15, nonlinear dielectric 16 and conductors 17 and 30 back to the battery. The other circuit for applying a light power potential extends from the power source 23 through conductor 32, electrode 12, electroluminescent material 13, opaque layer 14, electrode 15, the nonlinear dielectric material or capacitor 16, bus 17 and conductor 30 back to power source 23.

In the operation of an image producing screen connected as shown in FIG. 4, when the element shown generally at 10 receives a low light input, a high control potential is impressed on the ferroelectric capacitor 16. The result is that the impedance of the ferroelectric capacitor 16 is high and a large percentage of the potential delivered by the alternating current light power source 23 is applied across the capacitor 16. Under such conditions, the electroluminescent cell 13 will receive only a low light power potential across it and will be dark.

When the element 10 receives a high light input there will be a small control potential applied to the ferroelectric capacitor 16 and its impedance will be relatively low. Consequently, a smaller portion of the voltage delivered by the alternating current light power source 23 will be taken by the ferroelectric capacitor 16 and a much larger percentage of the light power potential will be applied across the electroluminescent material or cell 10. The result is that the electroluminescent material will become bright.

Therefore the luminosity of the different elements associated to make up a screen or the different portions of a single element screen will depend on the light delivered to the respective photoconductive cells. In this manner, a positive image may be established on the image-producing screen. Further, a continuance of the positive image developed in the manner described will depend on the continuance of the light input to the photoconductive material 18. By the proper choice of time constants for the members of the circuit system of FIG. 4 provision may be made for a substantially instantaneous change of the output image with the input image. It has been found that since the inputs to the photoconductive cell 18 and the impedance of the ferroelectric capacitor 16 increase and decrease together, it may be possible to leave out the resistor 37 in some circuit systems. This will depend on the conditions to be met in the circuit specification.

In some instances, it may be desired to produce a negative output image or the opposite of that produced by the circuit system of FIG. 4 described hereinbefore. In such case, the photoconductive cell 18 and the resistor 36 will be interchanged. In such a circuit system, the photoconductive cell 18 will be connected between the conductor 29 and the resistor 36 while the resistor 36 will be connected between the conductor 30 and the photoconductor 18.

The modification of the invention disclosed in FIG. 4 will find substantial use with X-ray motion fluoroscopy, conventional television image intensification and imaging of other continuously varying phenomena whose display does not require appreciable storage time.

Figure 5:
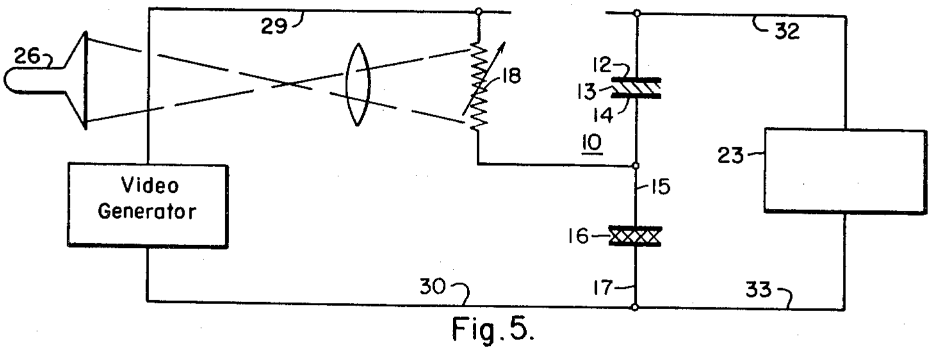
FIG. 5 is a diagram of a circuit system that may be utilized as a video storage display screen.

Referring now to FIG. 5 the circuit system illustrated is a modification of the invention which is suitable for a video storage display signal switching system. The circuit to be described is that required for a single element such as shown generally at 10. An image-producing display screen would comprise a number of elements such as 10. The number of elements required will depend on the size of the display screen to be provided.

The circuit system of FIG. 5 is very similar to the circuit system of FIG. 2. The main differences involve the substitution of a video generator 39 for the battery 21 and the elimination of the switches 22 and 24 that are provided in the system shown in FIG. 2.

The photoconductive material or cell 18 will be selected to meet the predetermined operating conditions of the circuit system. It has been found that the photoconductive cell 18 should have a high response speed in order to give proper functioning of the system.

In the embodiment of FIG. 5 the circuit for applying the control voltage extends from the video generator 39 through conductor 29, photoconductor 18, conductor 15, nonlinear dielectric material 16, bus 17, and conductor 30 back to the video generator. The circuit for supplying the light power potential may be traced from power source 23 through conductor 32, the electrode 12, electroluminescent material 13, the conductive graphite layer 14, conductor 15, nonlinear dielectric material 16, and conductor 33 back to power source 23.

In operation, the input sides of the elements assembled to make an image-producing screen are scanned continuously by the light from a constant intensity raster delivered by a cathode-ray tube 26 which is synchronized with the video generator which delivers the signal. The input light will be applied to any one element for only a very short time.

As the flying spot of the scanning beam delivered by the cathode-ray tube 26 moves across the numerous elements of the video screen, the elements of the circuit system will be connected in turn to the video bus 29 by means of the photoconductive materials or cells 18. In such manner, the nonlinear dielectric material of capacitor 16 of each element will be continuously subjected to the instantaneous potentials of the video generator 39 which determines the control charge delivered to each capacitor 16. Since the video generator delivers the voltage that controls the charging of the nonlinear dielectric capacitor 16 of each element, it also controls the light output of the electroluminescent material 13 of the elements 10.

When image of the flying spot on the cathode-ray tube passes from one element to the next, the photoconductive material 18 disconnects the nonlinear dielectric capacitor 16 of the trailing element from the video bus 29 and the signal delivered to the image-producing screen element prior to the passing of the flying spot will be maintained by the charge stored on the nonlinear dielectric capacitor 16. The image thus maintained will remain until reset by the beam delivered by the cathode-ray tube in the next scan.

It will be appreciated that the light from the cathode-ray screen supplied to the photoconductive material 18 may be of wave lengths that are not visible. Further, the cathode ray tube luminescence and the characteristics of the photoconductive material 18 may be so selected as to take optimum time-constant advantage of their combination.

Figure 6:
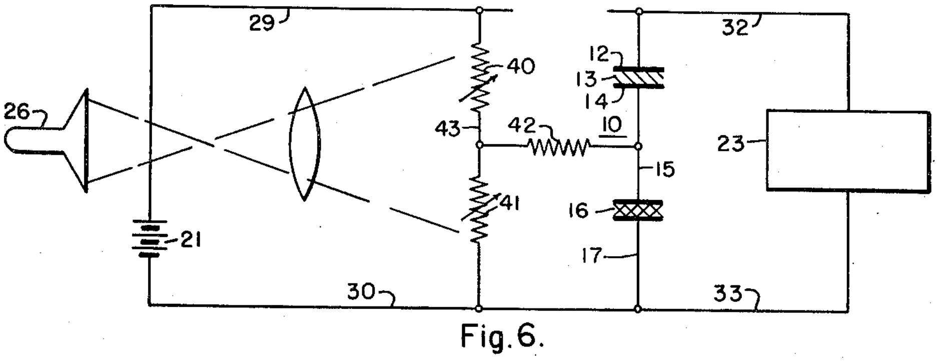
FIG. 6 is a diagram of a modified circuit system suitable for a video storage display screen.

In the modification of the invention illustrated in FIG. 6, two photoconductive cells 40 and 41 are connected in series circuit relationship between the conductors 29 and 30. A resistor 42 is connected to the conductor 15 which extends between the electroluminescent cell 13 and the ferroelectric capacitor 16 and to the conductor 43 connecting the photoconductive cells 40 and 41. A cathode ray tube 26 is provided for delivering a light beam to the photoconductive cells 40 and 41. However, it is to be understood that other image sources may be employed.

The circuit system disclosed in FIG. 6 is somewhat similar to the circuit systems disclosed in FIGS. 2 and 4. Instead of the resistor 36 provided in the system shown in FIG. 4 a second photoconductive cell 41 is employed. A cathode-ray tube 26 similar to the one provided in the circuit systems of FIGS. 2 and 4 is employed for delivering a beam of light to both of the photoconductive cells 40 and 41.

A photoconductive cell 40 capable of saturation at a low light level, that is, capable of being reduced to a minimum resistance value at such light level, will be selected. Further, the signal input or the input image should be provided with a light bias which is capable of effecting the saturation of the photoconductive cell 40. The light beam delivered by the cathode-ray tube 26 to the photoconductive cells 40 and 41 will be arranged to deliver an input signal of short duration.

When the input signal is delivered it lowers the resistivity of the photoconductive cell 41 in a manner similar to that described for the embodiment illustrated in FIG. 4. The photoconductive cell 40 serves as a switch to momentarily connect the ferroelectric capacitor 16 through the conductor 29 to the battery 21 to apply the control voltage. It performs somewhat the same function as the resistor 36 in the embodiment of the invention illustrated in FIG. 4, with the exception that the connection of the ferroelectric capacitor 16 to the bus 29 and the battery 21 is only of momentary duration. The system is arranged to establish the connection between the ferroelectric capacitor 16 and the bus 29 when the photoconductive cell 41 is receiving a signal through the cathode-ray tube 26. Since the photoconductive cell 40 connects the ferroelectric capacitor 16 of each element to the battery 21 at the time that it is receiving a signal, the capacitor 16 of each element is charged and will maintain a potential on the electroluminescent cell 13 of that element after the beam moves to the next element until it is reset during the next raster.

In the embodiment illustrated in FIG. 6, the photoconductors 40 and 41 may be made responsive to light of different wave lengths to produce a predetermined type of image on the output side. It would be possible to utilize a double input signal, that is, a signal having one component of constant intensity for energizing the photoconductor 40 and another component of varying intensity for delivering image information which energizes or actuates photoconductor 41.

Further in connection with FIG. 6, if the photoconductors 40 and 41 are so selected that they have different predetermined conductance characteristics with respect to their steady state response to radiations or light and similar characteristics with respect to time dependence then the response time of the screen element may be shortened relative to the response time of the photoconductors. Such a modification could also be utilized in screens for imaging continuously varying phenomena whose display does not require appreciable storage. These modifications in FIG. 6 would be useful in performing the functions performed by the circuit system of FIG. 4. The advantage of such a circuit system is primarily better time response.

In the embodiments of the invention described hereinbefore, a layer of opaque, conductive material 14 is provided in the different elements or units, the purpose of which is to prevent light from the output side interfering with the members on the input side and vice versa. It will be readily appreciated that this opaque conductive layer 14 is not required when the photoconductive material is not responsive to the wavelengths produced by the electroluminescent material.

In all of the embodiments, the element or units shown generally at 10 comprise two capacitors, an electroluminescent material 13, and a nonlinear dielectric material 14 connected in series circuit relationship. It will be obvious to anyone skilled in this art that, while it is required to employ electroluminescent and nonlinear dielectric materials, they may be connected in many different arrangements utilizing different numbers of capacitors to perform the functions that the two capacitors 13 and 16 perform in the circuits described. The geometry of the connections employed for the capacitors may be varied greatly and the electroluminescent and nonlinear dielectric materials will still perform the functions required and without departing from the scope of the invention disclosed.

When a resistive photoconductor is connected in series circuit relationship with a capacitive electroluminescent cell as has been taught in the prior art, the voltage across the electroluminescent cell decreases as the frequency increases.

When two capacitors such as 13 and 16 are employed as in any of the circuit systems disclosed, they are not frequency sensitive and thus the light power potential frequency can be increased. This enables the obtaining of a substantial increase in output brightness and in gain in the image-producing screen over what is possible with the light amplifiers employed in the art heretofore.

In the circuit systems disclosed, the input and output wave lengths need not be the same, for example, the input may be an "X-ray optical system" which can be converted into a visible output image. The input signal may also be an infra-red image which will give visible output images on the screen.

Elements or units 10 of the image-producing screens have been described both with and without opaque layers. In elements without opaque layers, it is possible to utilize the output image to energize the photoconductive members such as 40 and 41 in the embodiment illustrated in FIG. 6 to produce bistable operation. In such a modification, it will be necessary to select photoconductive cells which are sensitive to the output of the system.

Since certain changes may be made in the above constructions and different embodiments of the invention could be made without departing from the scope thereof, it is intended that all matter contained in the foregoing description or shown in the accompanying drawing shall be interpreted as illustrative and not in a limiting sense.

We claim as our invention:

1. In a solid state image producing screen, in combination, a direct current power source, a voltage divider comprising a resistor and a member of photoconductive material connected in circuit relationship and across the direct current power source, a member of nonlinear dielectric material connected through the voltage divider to the direct current power source, means for impressing radiation on the photoconductive member to control its conductivity, a member of electroluminescent material connected in circuit relationship with the nonlinear dielectric member, an alternating current power source connected in circuit relationship with the electroluminescent and nonlinear dielectric members, the alternating current power source serving to impress a voltage across the electroluminescent and nonlinear dielectric members, the division of the alternating current voltage across the electroluminescent member and the nonlinear dielectric member depending on the direct current control voltage impressed on the nonlinear dielectric member, the direct current control voltage varying with the conductivity of the photoconductive member.

2. In a solid state image producing screen, in combination, a direct current power source, a voltage divider comprising a resistor and a member of photoconductive material connected in circuit relationship, the voltage divider being connected across the direct current power source, a member of nonlinear dielectric material connected in circuit relationship with the direct current power source, an isolating resistor connected between the nonlinear dielectric member and the voltage divider, a member of electroluminescent material connected in circuit relationship with the nonlinear dielectric member, an alternating current power source connected across the electroluminescent and the nonlinear dielectric members, means for delivering radiation to the photoconductive member of the voltage divider to control its conductivity, the voltage divider cooperating to control the division of the alternating voltage applied across the electroluminescent and nonlinear dielectric members, the division of voltage depending upon the changes in conductivity of the photoconductive member in response to the signal radiation delivered.

3. In a solid state image producing screen, in combination, a video generator, a member of photoconductive material and a member of nonlinear dielectric member connected in cooperative circuit relationship and across the video generator, means for impressing radiation on the photoconductive member to vary its conductivity, the voltage across the nonlinear dielectric member varying with the conductivity of the photoconductive member and the radiation delivered to the photoconductive member, a member of electroluminescent material connected in cooperative circuit relationship with the nonlinear dielectric member, a time varying power source connected across the electroluminescent and nonlinear dielectric members to supply a light power potential, the division of the light power potential across the electroluminescent and the nonlinear dielectric members depending upon the voltage delivered to the nonlinear dielectric member in response to changes in conductivity in the photoconductive member.

4. In a solid state image producing screen, in combination, a video generator, a member of photoconductive material and a member of nonlinear dielectric material connected in series circuit relationship and across the video generator, means for delivering radiation to the photoconductive member to control its conductivity and the voltage impressed across the nonlinear dielectric member by the video generator, an alternating current power source, a member of electroluminescent material connected in series circuit relationship with the nonlinear dielectric member, the alternating current power source being connected across the electroluminescent member and nonlinear dielectric member connected in series relationship, the division of alternating current voltage between the electroluminescent and nonlinear dielectric members being controlled by the voltage delivered by the video generator to the nonlinear dielectric member which varies in response to the changes in conductivity of the photoconductive member in response to the radiation delivered.

5. In a solid state image producing screen, in combination, a direct current power source, a voltage divider comprising a plurality of members of photoconductive material connected in cooperative circuit relationship and across the direct current power source, a member of nonlinear dielectric material, an isolation resistor connected in circuit relationship with the nonlinear dielectric member, the nonlinear dielectric member and isolation resistor being connected across a first member of photoconductive material and through a second member of photoconductive material across the direct current power source, means for delivering signal radiation to the photoconductive members to control their photoconductivity and the direct current control voltage impressed across the nonlinear dielectric member, a member of electroluminescent material connected in circuit relationship with the nonlinear dielectric member, an alternating current power source connected across the electroluminescent member and the nonlinear dielectric member, the division of alternating current voltage between the electroluminescent member and the nonlinear dielectric member being controlled by the direct current control voltage impressed across the nonlinear dielectric member, the voltage impressed across the nonlinear dielectric member being controlled by the conductivity of the photoconductive members which change when subjected to signal radiation thereby to control the brightness of the electroluminescent member.

6. A solid state image producing screen comprising a nonlinear dielectric member, an electroluminescent member and a photoconductive member in mutual circuit relationship, a time varying light power source, a control power source, means associated with said control power source to charge said nonlinear dielectric member to a first potential during a first time period and to vary the potential by an amount related to the illumination on said photoconductive member during a second time period, and means associated with said time varying light power source to apply a light power potential across said electroluminescent member and said nonlinear dielectric member during or subsequent to said second time period.

7. A solid state image producing screen comprising a nonlinear dielectric member, an electroluminescent member and a photoconductive member in mutual circuit relationship, a time varying light power source, a control power source, means associated with said control power source to charge said nonlinear dielectric member to a first stored charge level simultaneously with the flooding of said photoconductive member by radiation to which it is sensitive to reduce the resistance thereof to a low level during a first time period and to vary the stored charge level by an amount related to the change in resistance due to signal bearing radiation on said photoconductive member during a second time period, and means associated with said time varying light power source to apply a light power potential across the electroluminescent member and said nonlinear dielectric member subsequent to said second time period.

8. A display system comprising a multielement solid state display screen each element of which includes an electroluminescent member, a nonlinear dielectric member and a photoconductive member mutually coupled in electrical circuit relationship; a time varying light power source; a control power source; means associated with said control power source to apply a control potential across the nonlinear dielectric members and the photoconductive members of a plurality of screen elements to impose a uniform stored charge on each of said nonlinear dielectric members simultaneously with the flooding of said photoconductive elements with radiation to which they are sensitive to reduce the resistance thereof to a uniform low level during a first time period and individually to vary the stored charge on each of said nonlinear dielectric members by an amount related to the change in resistance of the photoconductive member associated therewith due to signal bearing radiation during a second time period; and means associated with said time varying light power source to apply a light power potential across the electroluminescent members and the nonlinear dielectric members of said plurality of screen elements at a time subsequent to said second time period to form an image corresponding to the signal bearing radiation incident to the photoconductive members of said plurality of screen elements.

9. A display system comprising a multi-element solid state display screen each element of which includes an electroluminescent member, a nonlinear dielectric member, a photoconductive member and a resistive member coupled in electrical circuit relationship; a control power source and connective means to apply a control potential across a first circuit portion comprising said photoconductive member and said resistive member and across a second circuit portion comprising said resistive member and said nonlinear dielectric member of each of a plurality of screen elements; a time varying light power source applied across said electroluminescent member and said nonlinear dielectric member of each of said plurality of screen elements; each of said photo-conductive members responsive to radiation of an image imposed on said display screen to vary in resistance and to alter the amount of control charge imposed by said control power source on each of said nonlinear dielectric members to control the luminosity of each of said electroluminescent members.

10. A display system comprising a multielement solid state display screen each element of which includes an electroluminescent member, a nonlinear dielectric member and a photoconductive member mutually coupled in electrical circuit relationship; a video generator to apply a voltage across said nonlinear dielectric member and said photoconductive member of each of a plurality of screen elements; means to form a light beam of uniform intensity to sequentially scan the photoconductive members of each of said plurality of screen elements to reduce appreciably the resistance thereof and to impose charge on each of said nonlinear dielectric members in accordance with the voltage applied by said video generator; a time varying light power source applied across said electroluminescent member and said nonlinear dielectric member of each of said plurality of screen elements; the light output of said electroluminescent members being controlled by the magnitude of charge on said nonlinear dielectric members.

11. A display system comprising a multielement solid state display screen each element of which includes, in electrical circuit relationship, an electroluminescent member, a nonlinear dielectric member, a first photoconductive member having minimum resistance value at a first light level and a second photoconductive member having minimum resistance value at a second light level substantially higher than said first light level; a control power source to apply a control potential across a first circuit portion comprising said first and second photoconductive members and across a second circuit portion comprising said first photoconductive member and said nonlinear dielectric member of each of a plurality of screen elements; means to form a light beam of a light level at least equal to said first light level to sequentially scan the first photoconductive members of each of said plurality of screen elements to drive the resistance thereof to its minimum value; means to form a signal bearing light beam to sequentially scan the second photoconductive members of each of said plurality of screen elements in synchronism with the scanning of said first photoconductive members to reduce the resistance of said second photoconductive members by an amount related to a signal supplied by said signal bearing light beam to alter the charge applied by said control power source on said nonlinear dielectric members; a time varying light power source applied across said electroluminescent members and said nonlinear dielectric members of each of said plurality of screen elements to produce light output from said electroluminescent members in accordance with said charge stored on each of said nonlinear dielectric members.

References Cited in the file of this patent

UNITED STATES PATENTS

| | | |
|---|---|---|
| 2,816,236 | Rosen | Dec. 10, 1957 |
| 2,905,830 | Kazan | Sept. 22, 1959 |